(12) United States Patent
Yen et al.

(10) Patent No.: US 8,766,279 B1
(45) Date of Patent: Jul. 1, 2014

(54) SIC-BASED TRENCH-TYPE SCHOTTKY DEVICE

(71) Applicant: Industrial Technology Research Institute, Hsin-Chu (TW)

(72) Inventors: Cheng-Tyng Yen, Kaohsiung (TW);
Young-Shying Chen, Hsinchu (TW);
Chien-Chung Hung, Hsinchu (TW);
Chwan-Ying Lee, Hsinchu (TW);
Chiao-Shun Chuang, Hsinchu (TW);
Kai-Yu Chen, Shanghai (CN);
Cheng-Chin Huang, Taichung (TW)

(73) Assignee: Industrial Technology Research institute, Hsin-Chu (TW)

( * ) Notice: Subject to any disclaimer, the term of this patent is extended or adjusted under 35 U.S.C. 154(b) by 14 days.

(21) Appl. No.: 13/727,432

(22) Filed: Dec. 26, 2012

(30) Foreign Application Priority Data

Dec. 20, 2012 (TW) .............................. 101148717 A (51) Int. Cl.
*H01L 29/24* (2006.01)

(52) U.S. Cl.
USPC .......................................................... 257/77

(58) Field of Classification Search
USPC .......................................................... 257/77
See application file for complete search history.

(56) References Cited

U.S. PATENT DOCUMENTS

| | | | | |
|---|---|---|---|---|
| 5,323,040 A | * | 6/1994 | Baliga | 257/332 |
| 5,506,421 A | * | 4/1996 | Palmour | 257/77 |
| 5,612,232 A | * | 3/1997 | Thero et al. | 438/571 |
| 6,362,495 B1 | | 3/2002 | Schoen et al. | |
| 6,562,706 B1 | | 5/2003 | Liu et al. | |
| 7,078,781 B2 | | 7/2006 | Hatakeyama et al. | |
| 7,323,402 B2 | | 1/2008 | Chiola | |
| 7,754,550 B2 | | 7/2010 | Chiola et al. | |
| 7,973,381 B2 | | 7/2011 | Chiola | |
| 7,982,265 B2 | * | 7/2011 | Challa et al. | 257/341 |
| 2008/0105879 A1 | | 5/2008 | Kuramachi et al. | |

OTHER PUBLICATIONS

Singh Ranbir, Reliability and Performance Limitations in SiC Power Devices, Microelectronics Reliability, 2006, vol. 46, pp. 713-730.
Roccaforte et al., Richardson's Constant in Inhomogeneous Silicon Carbide Schottky Contacts, Journal of Applied Physics, 2003, vol. 93 (11), pp. 9137-9144.
Weitzel, et al., Silicon Carbide High Power Devices, IEEE Transactions on Electron Devices, 1996, vol. 43 (10), pp. 1732-1741.
Takahata, et al., Three-Dimensional Silicon Fabrication Using Microloading Effects With a Rectangular Aperture Mask, Journal of Micromechanics and Microengineering, 2010, vol. 20, 075022.
Chu et al., An Improvement of Trench Profile of 4H-SiC Trench MOS Barrier Schottky (TMBS) Rectifier, 9 European Conference on Silicon Carbide & Related Materials, ECSCRM 2012.
The 9th European Conference on Silicon Carbide and Related Materials, 2012, Saint-Petersburg, Russia.

* cited by examiner

*Primary Examiner* — Thao P Le
(74) *Attorney, Agent, or Firm* — Morris Manning & Martin LLP; Tim Tingkang Xia, Esq.

(57) ABSTRACT

A SiC-based trench-type Schottky device is disclosed. The device includes: a SiC substrate having first and second surfaces; a first contact metal formed on the second surface and configured for forming an ohmic contact on the substrate; a drift layer formed on the first surface and including a cell region and a termination region enclosing the cell region; a plurality of first trenches with a first depth formed in the cell region; a plurality of second trenches with a second depth less than the first depth; a plurality of mesas formed in the substrate, each defined between neighboring ones of the trenches; an insulating layer formed on sidewalls and bottoms of the trenches; and a second contact metal formed on the mesas and the insulating layer, extending from the cell region to the termination region, and configured for forming a Schottky contact on the mesas of the substrate.

13 Claims, 7 Drawing Sheets

SIC-BASED TRENCH-TYPE SCHOTTKY DEVICE

CROSS REFERENCE TO RELATED APPLICATION

The present application is based on, and claims priority from, Taiwan Application Serial Number 101148717, filed on Dec. 20, 2012, the disclosure of which is hereby incorporated by reference herein in its entirety

TECHNICAL FIELD

The present disclosure relates to a SiC-based trench-type Schottky device.

BACKGROUND

A Schottky barrier diode is an unipolar device in which electrons serve as the main charge carriers for transporting current. The device has a low forward voltage drop and a fast switching. However, the leakage current of Schottky diodes increases as reverse bias increases because of the lowering of Schottky barrier under high electric field. To reduce the leakage current at the reverse bias, a high work function is usually used to provide a high Schottky barrier, which will in turn increase the forward voltage drop and turn-on power loss of the device. The Schottky diode with a trench structure is one of solutions proposed to compromise above mentioned trade-offs. A trench-ype Schottky dioe usually comprises a plurality of mesas separated by a plurality of trenches. A Schottky contact with a lower barrier formed on the mesa provides a low forward voltage drop, while a MOS structure or a Schottky contact with a higher barrier formed in the trenches shield the electric field on the low barrier contact and thus reduces the leakage current at the reverse bias.

A edge termination structure is usually incorporated in Schottky devices to prevent the premature breakdown due to surface field crowding around the edge of electrode. The edge termination structure may be a field plate, a junction termination extension (JTE) or a floating guard rings. JTE and floating guard rings form pn junctions by ion implantations around the edges of the device to perturb the surface electric field distribution and improve the blocking capability of the device. In SiC carbide devices, the ion implantation is usually implemented at up to several hundred ° C. and then post-annealed at a temperature above 1600° C. to activate the dopants, thus make it a costly process. Etch terminations such as bevels used in silicon thyristors require a large area and are also not applicable for devices without PNpn junctions.

SUMMARY

According to one aspect of the present disclosure, one embodiment provides a SiC-based trench-type Schottky device comprising: a SiC substrate having a first surface and an opposing second surface; a first contact metal formed on the second surface of the SiC substrate and configured for forming an ohmic contact between the first contact metal and the SiC substrate; a SiC drift layer formed on the first surface of the SiC substrate and including a cell region and a termination region enclosing the cell region; a plurality of first spaced trenches with a first depth formed in the cell region; a plurality of second spaced trenches with a second depth less than the first depth; a plurality of mesas formed in the SiC drift layer, each defined between neighboring ones of the spaced trenches; an insulating layer formed on sidewalls and bottoms of the spaced trenches; and a second contact metal formed on the mesas and the insulating layer, extending from the cell region to the termination region, and configured for forming a Schottky contact between the second contact metal and the mesas of the SiC substrate.

According to another aspect of the present disclosure, another embodiment provides a SiC-based trench-type Schottky device comprising: a SiC substrate having a first surface and an opposing second surface; a first contact metal formed on the second surface of the SiC substrate and configured for forming an ohmic contact between the first contact metal and the SiC substrate; a SiC drift layer formed on the first surface of the SiC substrate and including a cell region and a termination region enclosing the cell region; a plurality of first spaced trenches with a first depth formed in the cell region; a plurality of second spaced trenches with a second depth less than the first depth; a plurality of mesas formed in the SiC drift layer, each defined between neighboring ones of the spaced trenches; a second contact metal layer formed on the mesas and configured for forming a first Schottky contact between the second contact metal and the mesas of the SiC substrate; and a third contact metal formed on sidewalls and bottoms of the spaced trenches and configured for forming a second Schottky contact between the third contact metal and the sidewalls and bottoms of the spaced trenches of the SiC substrate; wherein work function of the second contact metal is less than that of the third contact metal.

In some embodiments, the ratio of the opening area of the second spaced trenches in total to the area of the termination region is larger than the ratio of the opening area of the first spaced trenches in total to the area of the cell region.

In some embodiments, the SiC drift layer further comprises: a transition region interposed between the cell region and the termination region, wherein a plurality of third spaced trenches with a third depth less than the first depth and more than the second depth are formed in the transition region.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

For further understanding and recognizing the fulfilled functions and structural characteristics of the disclosure, several exemplary embodiments cooperating with detailed description are presented as the following.

Figure 1:
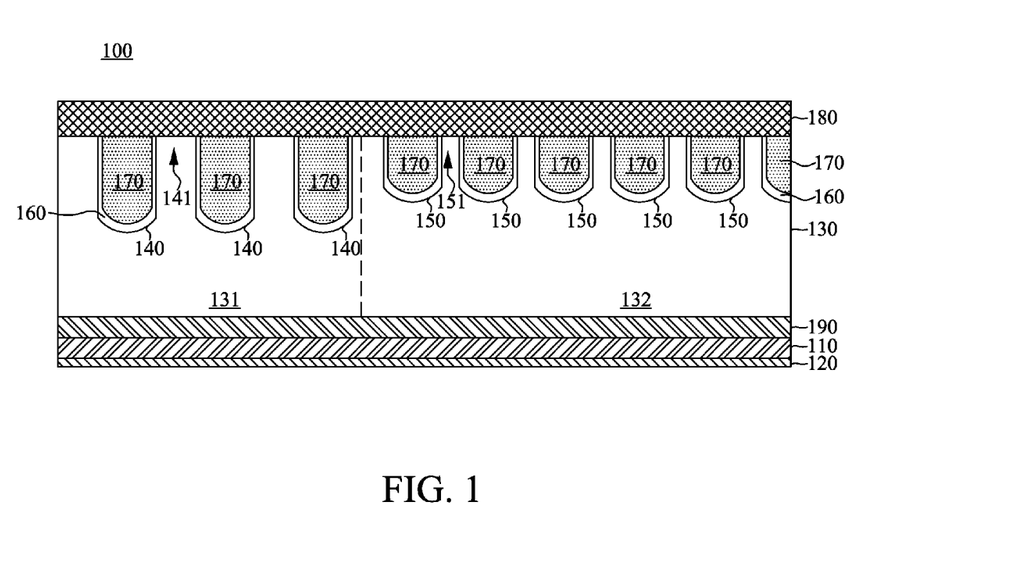
FIG. 1 schematically shows a vertical cross-section diagram of a SiC-based trench-type Schottky device according to a first embodiment of the present disclosure.

FIG. 1 schematically shows a vertical cross-section diagram of a SiC-based trench-type Schottky device according to a first embodiment of the present disclosure. As shown in FIG. 1, the Schottky device 100 includes a SiC substrate 110, a first contact metal 120, a SiC drift layer 130, a plurality of first spaced trenches 140, a plurality of second spaced trenches 150, a plurality of mesas 141 and 151, an insulating layer 160, a conductor member 170, and a second contact metal 180. Each component of the Schottky device 100 will be described below in detail.

The SiC substrate 110 is used as a supporting body for the Schottky device 100 and the fabrication thereof in the semiconductor manufacturing process. In the embodiment, the SiC substrate 110 can be a heavily doped N-type (referred to as $N^+$-type hereinafter) 4H—SiC semiconductor substrate; for example, an $N^+$-type 4H—SiC wafer of 4 inches in diameter and 350 μm in thickness with a dopant concentration of $1 \times 10^{19}$ cm$^{-3}$. Here, 4H is one of polytype forms of silicon carbide (SiC), and "H" means the hexagonal crystal lattice structure. But it is not limited thereto; the SiC substrate 110 can be of another polytype of silicon carbide, such as 3C—SiC, 6H—SiC, or 15R—SiC, where "C" and "R" denote the cubic and rhombohedral crystal lattice structures, respectively.

The SiC substrate 110 has an upper surface and an opposing lower surface. The first contact metal 120 can be disposed on the lower surface of the SiC substrate 110 to form an ohmic contact of low resistance between the first contact metal 120 and the SiC substrate 110. Thus, the first contact metal 120 can be used as a cathode of the Schottky device 100. The first contact metal 120 can formed of nickel (Ni). For example, a Ni film with a thickness of 200 nm can be deposited by the physical vapor deposition (PVD) and treated by annealing at 950° C. for 30 minutes, so that an ohmic contact can be formed on the lower surface of the $N^+$-type 4H—SiC substrate 110. But it is not limited thereto; the first contact metal 120 can be formed of another metal material and/or of another thickness. It is noticed that the Schottky device 100 is to be fabricated on the upper surface of the SiC substrate 110.

The SiC drift layer 130 can be formed on the upper surface of the SiC substrate 110, so as to provide a main body for trench fabrication and device operation of the trench-type Schottky device according to the embodiment. Here, the SiC drift layer 130 can be a lightly doped N-type (referred to as $N^-$-type hereinafter) 4H—SiC epitaxial layer. For example, the SiC drift layer 130 can be formed of an $N^-$-type 4H—SiC epitaxial layer of 6 μm in thickness with a dopant concentration of $6 \times 10^{15}$ cm$^{-3}$. But it is not limited thereto; the SiC drift layer 130 can be of another polytype of silicon carbide, such as 3C—SiC, 6H—SiC, or 15R—SiC, of another thickness and dopant concentration. Moreover, a buffer layer 190 of N-type 4H—SiC can be disposed between the SiC drift layer 130 and the SiC substrate 110, so as to reduce the defects produced during the epitaxial growth of the SiC drift layer 130, such as micropipe density (MPD) and etching pit density (EPD).

Figure 2:
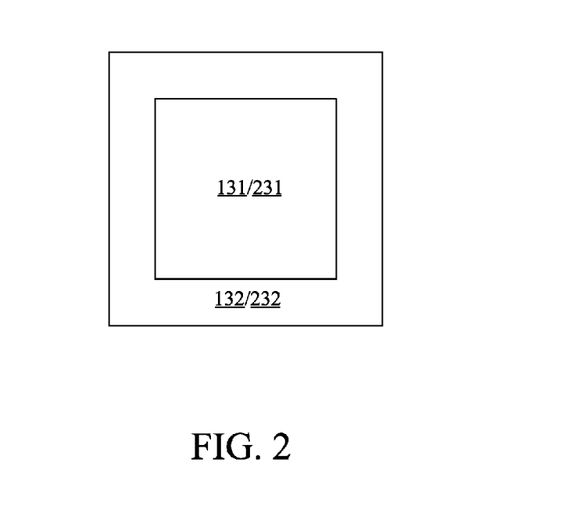
FIG. 2 schematically shows a top-view layout of the SiC-based trench-type Schottky device in the first embodiment.

FIG. 2 schematically shows a top-view layout of the SiC-based trench-type Schottky device 100 in the first embodiment. Referring to both FIGS. 1 and 2, the top surface of the SiC drift layer 130 can be arranged into a cell region 131 and a termination region 132, wherein the termination region 132 is disposed around the edge area of the Schottky device 100, and the cell region 131 is disposed at the center area of the Schottky device 100 and enclosed by the termination region 132. Concurrently, the first spaced trenches 140 having a first trench depth and the second spaced trenches 150 having a second trench depth can be formed in the cell region 131 and the termination region 132, respectively, by the photolithography and the reactive ion etching (RIE) processes. For example, a first SiO$_2$ layer (not shown) with a thickness of 3 μm can be deposited on the SiC drift layer 130. Then, the top-view patterns of the first spaced trenches 140, the second spaced trenches 150, and the mesas 141 and 151 can be defined by using the photolithography, so as to remove photoresist above the first and second spaced trenches 140 and 150 and reserve photoresist above the mesas 141 and 151. The CF$_4$/O$_2$ gas can be used in the RIE process to remove the exposed areas of the first SiO$_2$ layer, and the remaining first SiO$_2$ layer can be used as a hard mask for the following trench etching. Thus, the first and second spaced trenches 140 and 150 can be formed in the SiC drift layer 130 by using the RIE process with the SF$_6$/O$_2$ gas.

In the trench etching, proper conditions of the RIE process can be tuned and suitable opening patterns of the first and second spaced trenches 140 and 150 can be set, so that the ratio of the opening area of the second spaced trenches 150 in total to the area of the termination region 132 is larger than the ratio of the opening area of the first spaced trenches 140 in total to the area of the cell region 131, after the spaced trenches 140 and 150 are fabricated. For instance, the opening pattern of each second spaced trench 150 can be larger than that of each first spaced trench 140, so that the etching rate for the second spaced trenches 150 is less than that for the first spaced trenches 140 due to the etching gas may be locally consumed faster at the second spaced trenches 150 and hence their etching rate is relatively lower. In another example, the aspect ratio of opening patterns of the first spaced trenches 140 can be less than that of the second spaced trenches 150, so that the etched depth of the second spaced trenches 150 in the termination region 132 can be less than that of the first spaced trenches 140 in the cell region 131 after the RIE process, according to the microloading effect and the aspect ratio dependent etch rate (ARDE) effect in the RIE, as mentioned in, for example, J. Vac. Sci. Technol. A, 12(4), p. 1962, 1994. and J. Micromech. Microeng. 20, 075022, 2010

After the trench etching, the first SiO$_2$ layer can be removed, for example, by the hydrogen fluoride (HF) etching. Then, a second SiO$_2$ film (not shown) with a thickness of 50 nm can be grown on the SiC drift layer 130 by the wet oxidation process, and a second SiO$_2$ film (not shown) with a thickness of 200 nm can be grown on the first SiO$_2$ film by the plasma-enhanced chemical vapor deposition (PECVD) process. Hereafter, the combination of the first and second SiO$_2$ films is referred to as the second SiO$_2$ layer. Next, a photoresist layer (not shown) with a thickness of about 1000 nm can be spin-coated on the second $SiO_2$ layer, and then the second $SiO_2$ layer on the mesas 141 and 151 is removed by the etching back process. After the remaining photoresist layer is then removed, the second $SiO_2$ layer on the sidewalls and bottoms of the first and second spaced trenches 140 and 150 remains to be the insulating layer 160.

Then, the conducting material 170 can be fabricated, for example, by depositing a heavily doped polysilicon layer with a thickness of about 2 μm on the SiC drift layer 130, so as to fill the spaced trenches 140 and 150. After that, the Chemical Mechanical Planarization (CMP) process can be applied to the extra polysilicon and stop at the upper surfaces of the mesas 141 and 151. The conducting material 170 is formed of the polysilicon filled in the spaced trenches 140 and 150.

To fabricate the second contact metal 180, for example, a Ti film with a thickness of 50 nm can be deposited on the SiC drift layer 130 to cover the spaced trenches 140 and 150 and the conductor members 170. The Ti film is then treated by annealing at 500° C. for 10 minutes, so that a Schottky contact can be formed on the mesas 141 and 151, between the Ti film and the SiC drift layer 130. After that, an Al—Si or Al—Cu alloy layer (not shown) with a thickness of 4 μm can be deposited on the Ti film, extending from the cell region 131 to the termination region 132, to be used as an anode of the Schottky device 100. Wherein, the combination of the Ti film and the alloy film is referred to as the second contact metal 180.

After the above fabrication process, the Schottky devices formed on the $N^+$-type 4H—SiC wafer (the SiC substrate) can be separated into individual Schottky device dice, by the die sawing or laser cutting along scribe lines in the termination region 132. Each Schottky device die can be further packaged to be a discrete SiC-based trench-type Schottky device of the present embodiment. Moreover, the horizontal cross-sections of the first and second spaced trenches 140 and 150 can be shaped in bars, rectangles, or hexagons; but the present disclosure is not limited thereto.

Regarding a semiconductor device involved in high current and voltage, such as a thyristor, its termination region is usually formed in a beveled structure, especially in a positive bevel, by mechanical cutting. Since defects would be produced on its edge surfaces due to the mechanical cutting, the maximum endurable breakdown voltage in the termination region is less than that in the cell region of the device. The reason for the positive bevel formed in the termination region is that the semiconductor pn junction may have a wider depletion region in its beveled termination surface than in its cell region, leading that the electric field would have a smaller strength at the bevel of the termination region than in the cell region, so as to prevent a premature breakdown happened in the termination region. For example, the electric field strength in the termination region is about 70% of that in the cell region for a bevel of 45° angle. Nevertheless, a beveled semiconductor device may have manufacturing cost disadvantages in the mechanical cutting and polishing treatment and layout area substrate wafer, so it is not applicable to the SiC-based device with a small area, such as a Schottky diode.

The SiC material itself has a threshold breakdown voltage higher than that of Si, so a SiC-based pn junction can be reverse-biased to enter the reach-through mode, i.e., the lightly doped drift layer of a SiC-based device can be depleted completely. In the embodiments of the present disclosure, the deeper first spaced trenches 140 are formed in the cell region 131, for example, with a depth of 2 μm, while the shallower second spaced trenches 150 are formed in the termination region 132, for example, with a depth of 0.7 μm. Thereby, the electric field strength in the termination region 132 can be about 75% of that in the cell region 131, so the edge termination can function well. This provides cost advantages by avoiding expensive ion implantation and high-temperature annealing processes and bevel cutting treatment in the device manufacturing.

Figure 3:
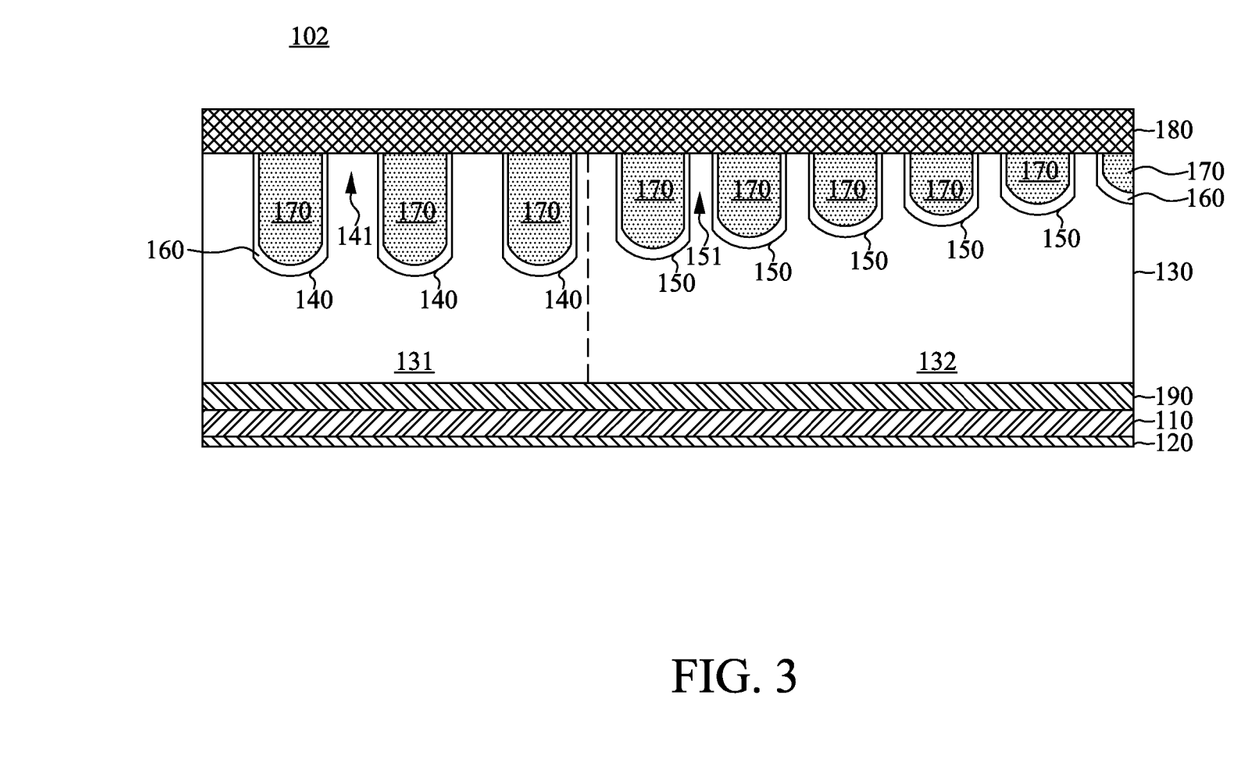
FIG. 3 schematically shows a vertical cross-section diagram of a SiC-based trench-type Schottky device according to a second embodiment of the present disclosure.

FIG. 3 schematically shows a vertical cross-section diagram of a SiC-based trench-type Schottky device 102 according to a second embodiment of the present disclosure. A top-view layout of the Schottky device 102 in the embodiment can be referred to FIG. 2, also. Referring to both FIGS. 2 and 3, the first spaced trenches 140 can have uniform depths in the cell region 131, while the second spaced trenches 150 can have stepped depths in the termination region 132, wherein the second spaced trenches 150 can have decreasing depths as further away from the cell region 131, and the maximum depth of the second spaced trenches 150 can be less than the depth of the first spaced trenches 140. Fabrication process of the Schottky device 102 in this embodiment is similar to that of the Schottky device 100 in the first embodiment, except that the first spaced trenches 140 in the cell region 131 can have opening pattern of uniform size while the second spaced trenches 150 in the termination region 132 can have opening patterns of increasing size. Consequently, the ratio of the opening area of the second spaced trenches 150 in total to the area of the termination region 132 is larger than the ratio of the opening area of the first spaced trenches 140 in total to the area of the cell region 131. Also, each of the second spaced trenches 150 can have a larger opening area than the first spaced trenches 140, and the second spaced trench 150 close to the cell region 131 can have a larger opening area than the one away from the cell region 131. Thereby, the first spaced trenches 140 and the second spaced trenches 150 can be fabricated concurrently in the SiC drift layer 130, with the second spaced trenches 150 having decreasing depths as further away from the center of the Schottky device 102. The device reliability can be improved due to gradual decrease of electric field in the termination region 132 when the Schottky device 102 is in the reverse-biased mode.

Figure 4A:
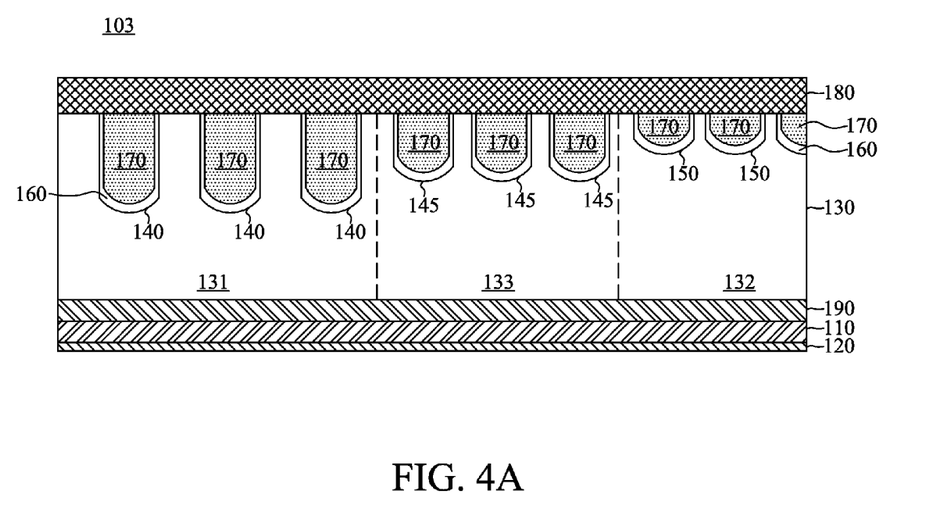
FIGS. 4A and 4B schematically show vertical cross-section and top-view layout diagrams of a SiC-based trench-type Schottky device according to a third embodiment of the present disclosure, respectively.
Figure 4B:
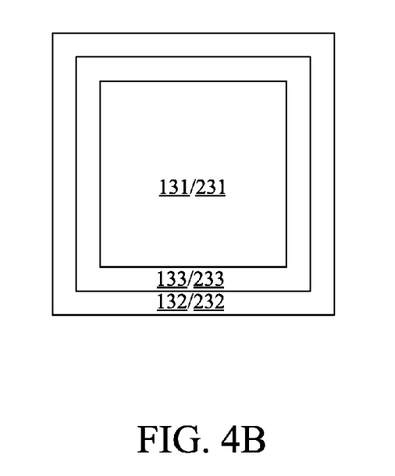

FIGS. 4A and 4B schematically show vertical cross-section and top-view layout diagrams of a SiC-based trench-type Schottky device 103, respectively, according to a third embodiment of the present disclosure. Referring to FIGS. 4A and 4B, the top surface of the SiC drift layer 130 can include a transition region 133 interposed between the cell region 131 and the termination region 132. A plurality of third spaced trenches 145 can be formed in the transition region 133, which functions as a buffer region between the cell region 131 and the termination region 132. Uniformly, the first spaced trenches 140 can have a first depth, the second spaced trenches 150 can have a second depth, and the third spaced trenches 145 can have a third depth, with the third depth less than the first depth and more than the second depth. Fabrication process and the other composition parts of the Schottky device 103 in this embodiment are similar to that of the Schottky device 100 in the first embodiment.

In the embodiment, the first spaced trenches 140 in the cell region 131 can have a first opening pattern of uniform size, the second spaced trenches 150 in the termination region 132 can have a second opening pattern of uniform size, and the third spaced trenches 145 in the transition region 133 can have a third opening pattern of uniform size, so that the ratio of the opening area of the third spaced trenches 145 in total to the area of the transition region 133 is larger than the ratio of the opening area of the first spaced trenches 140 in total to the area of the cell region 131 while less than the ratio of the opening area of the second spaced trenches 150 in total to the area of the termination region 132. For example, each of the third spaced trenches 145 can have an opening area larger than each of the first spaced trenches 140 while less than each of the second spaced trenches 150. Thereby, according to the fabrication process similar to the first embodiment, the first spaced trenches 140, the third spaced trenches 145, and the second spaced trenches 150 can be fabricated concurrently in the SiC drift layer 130 with the trenches 140, 145, and 150 having decreasingly stepped depths as further away from the center of the Schottky device 103. The device reliability can be improved due to gradual decrease of electric field in the Schottky device 103 when it is in the reverse-biased mode.

Figure 5:
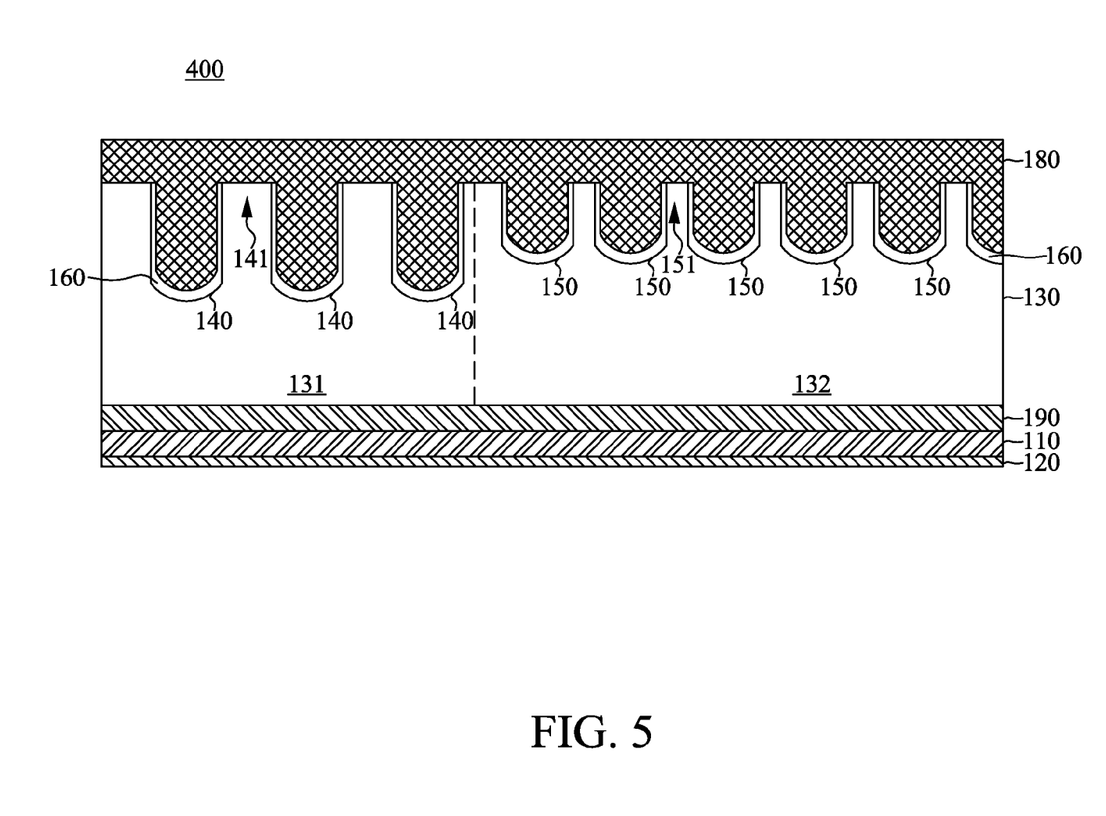
FIG. 5 schematically shows a vertical cross-section diagram of the SiC-based trench-type Schottky device in the fourth embodiment.

FIG. 5 schematically shows a vertical cross-section diagram of the SiC-based trench-type Schottky device 400 in the fourth embodiment, which is the same as the first embodiment except that the polysilicon layer filled in the trenches is omitted. Referring to FIG. 5, the top surface of the SiC drift layer 130 can be arranged into a cell region 131 and a termination region 132, wherein the termination region 132 is disposed around the edge area of the Schottky device 400, and the cell region 131 is disposed at the center area of the Schottky device 400 and enclosed by the termination region 132. A first $SiO_2$ layer (not shown) with a thickness of 3 μm can be deposited on the SiC drift layer 130. Then, the top-view patterns of the first spaced trenches 140, the second spaced trenches 150, and the mesas 141 and 151 can be defined by using the photolithography, so as to remove photoresist (not shown) above the first and second spaced trenches 140 and 150 and reserve photoresist (not shown) above the mesas 141 and 151. The $CF_4/O_2$ gas can be used in the RIE process to remove the exposed areas of the first $SiO_2$ layer, and the remaining first $SiO_2$ layer can be used as a hard mask for the following trench etching. Thus, the first and second spaced trenches 140 and 150 can be formed in the SiC drift layer 130 by using the RIE process with the $SF_6/O_2$ gas.

In the trench etching, proper conditions of the RIE process can be tuned and suitable opening patterns of the first spaced trenches 140 in the cell region 131 and the second spaced trenches 150 in the termination region 132 can be set, so that the second spaced trenches 150 can have an opening area larger than the first spaced trenches 140. Thus, the etching rate for the second spaced trenches 150 is less than that for the first spaced trenches 140 due to the etching gas may be locally consumed too much at the second spaced trenches 150 and hence their etching rate is decreased temporarily. In another example, the aspect ratio of opening patterns of the first spaced trenches 140 can be less than that of the second spaced trenches 150, so that the trench depth of the second spaced trenches 150 in the termination region 132 can be less than that of the first spaced trenches 140 in the cell region 131 after the RIE process, according to the microloading effect and the ARDE effect in the RIE. After the trench etching, the first $SiO_2$ layer can be removed, for example, by the HF etching. Then, a second $SiO_2$ film (not shown) with a thickness of 50 nm can be grown on the SiC drift layer 130 by the wet oxidation process, and a second $SiO_2$ film (not shown) with a thickness of 200 nm can be grown on the first $SiO_2$ film by the PECVD process. Hereafter, the combination of the first and second $SiO_2$ films is referred to as the second $SiO_2$ layer. Next, a photoresist layer (not shown) with a thickness of about 1000 nm can be spin-coated on the second $SiO_2$ layer, and then the second $SiO_2$ layer on the mesas 141 and 151 is removed by the etching back process. After the remaining photoresist layer is then removed, the second $SiO_2$ layer on the sidewalls and bottoms of the first and second spaced trenches 140 and 150 remains to be the insulating layer 160.

To fabricate the second contact metal 180, for example, a Ti film with a thickness of 50 nm can be deposited on the SiC drift layer 130 and concurrently fill the spaced trenches 140 and 150. The second contact metal 180 can take the place of the conducting material 170 and cover the insulating layer 160 layer in the first embodiment. Then, the Ti film is treated by annealing at 500° C. for 10 minutes, so that Schottky contacts can be formed on the mesas 141 and 151, between the second contact metal 180 and the SiC drift layer 130. Thus, the MOS structure can be formed in the trenches 140 and 150 and the Schottky contacts of the Schottky device 400 can be formed, both due to the formation of the Ti film.

After that, an Al—Si or Al—Cu alloy layer with a thickness of 4 μm can be deposited on the Ti film, extending from the cell region 131 to the termination region 132, to be used as an anode of the Schottky device 400. Wherein, the combination of the Ti film and the alloy film is referred to as the second contact metal 180. After the above fabrication process, the Schottky devices 400 formed on the SiC wafer (the SiC substrate) can be separated into individual Schottky device dice, by the die sawing or laser cutting along scribe lines in the termination region 132. Each Schottky device die can be further packaged to be a discrete SiC-based trench-type Schottky device of this embodiment.

Figure 6:
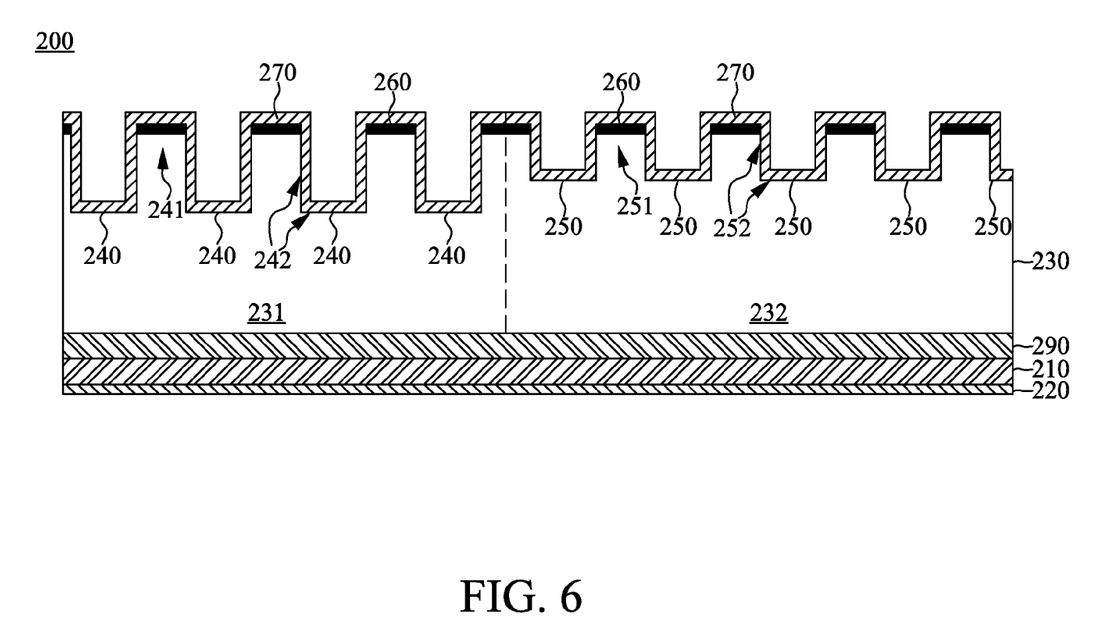
FIG. 6 schematically shows a vertical cross-section diagram of a SiC-based trench-type Schottky device according to a fifth embodiment of the present disclosure.

In the present disclosure, one of the main features can be that trenches of different depths are respectively formed in the cell and termination regions of the SiC-based Schottky device, and it can be applicable to the Schottky device with the structure of dual-metal trench-type barrier devices as described below. FIG. 6 schematically shows a vertical cross-section diagram of a SiC-based trench-type Schottky device according to a fifth embodiment of the present disclosure, which is similar to the structure of the first embodiment, except for adapting the dual-metal trench barriers. As shown in FIG. 6, the Schottky device 200 includes a SiC substrate 210, a first contact metal 220, a SiC drift layer 230, a plurality of first spaced trenches 240, a plurality of second spaced trenches 250, a plurality of mesas 241 and 251, a second contact metal 260, and a third contact metal 270. Each component of the Schottky device 200 will be described below in detail.

The SiC substrate 210 is used as a supporting body for the Schottky device 200 and the fabrication thereof in the manufacturing process. In the embodiment, the SiC substrate 210 can be a $N^+$-type 4H—SiC semiconductor substrate; for example, an $N^+$-type 4H—SiC wafer of 4 inches in diameter and 350 μm in thickness with a dopant concentration of $1 \times 10^{19}$ cm$^{-3}$. Here, 4H is one of polytype forms of SiC. But it is not limited thereto; the SiC substrate 210 can be of another polytype of silicon carbide, such as 3C—SiC, 6H—SiC, or 15R—SiC.

The SiC substrate 210 has an upper surface and an opposing lower surface. The first contact metal 220 can be disposed on the lower surface of the SiC substrate 210 to form an ohmic contact of low resistance between the first contact metal 220 and the SiC substrate 210. Thus, the first contact metal 220 can be used as a cathode of the Schottky device 200. The first contact metal 220 can formed of Ni. For example, a Ni film with a thickness of 200 nm can be deposited by the PVD and treated by annealing at 950° C. for 30 minutes, so that an ohmic contact can be formed on the lower surface of the $N^+$-type 4H—SiC substrate 210. But it is not limited thereto; the first contact metal 220 can be formed of another metal material and/or of another thickness. It is noticed that the Schottky device 200 is to be fabricated on the upper surface of the SiC substrate 210.

The SiC drift layer 230 can be formed on the upper surface of the SiC substrate 210, so as to provide a main body for trench fabrication and device operation of the trench-type Schottky device according to the embodiment. Here, the SiC drift layer 230 can be an N⁻-type 4H—SiC epitaxial layer. For example, the SiC drift layer 230 can be formed of an N⁻-type 4H—SiC epitaxial layer of 6 μm in thickness with a dopant concentration of $6 \times 10^{15}$ cm⁻³. But it is not limited thereto; the SiC drift layer 230 can be of another polytype of silicon carbide, such as 3C—SiC, 6H—SiC, or 15R—SiC, of another thickness and dopant concentration. Moreover, a buffer layer 290 of N-type 4H—SiC can be disposed between the SiC drift layer 230 and the SiC substrate 210, so as to reduce the defects produced during the epitaxial growth of the SiC drift layer 230, such as MPD and EPD.

FIG. 2 can also provide top-view layout of the SiC-based trench-type Schottky device 200 in the present embodiment. Referring to both FIGS. 6 and 2, the top surface of the SiC drift layer 230 can be arranged into a cell region 231 and a termination region 232, wherein the termination region 232 is disposed around the edge area of the Schottky device 200, and the cell region 231 is disposed at the center area of the Schottky device 200 and enclosed by the termination region 232. To fabricate the second contact metal 260, for example, a Ti film with a thickness of 50 nm and a 3 μm oxide layer can be deposited on the SiC drift layer 230 in sequence, and then the top-view patterns of the first spaced trenches 240, the second spaced trenches 250, and the mesas 241 and 251 can be defined by using the photolithography, so as to remove photoresist above the first and second spaced trenches 240 and 250 and reserve photoresist above the mesas 241 and 251. The CF4 gas can be used in the RIE process to remove the exposed areas of the oxide film, and the oxide film can be used as a hard mask for removing the exposed Ti layer and the following trench etching. Thus, the first and second spaced trenches 240 and 250 can be formed in the SiC drift layer 230 by using the RIE process with the $SF_6/O_2$ gas.

In the trench etching, proper etching of the RIE process can be tuned and suitable opening patterns of the first and second spaced trenches 240 and 250 can be set, so that the ratio of the opening area of the second spaced trenches 250 in total to the area of the termination region 232 is larger than the ratio of the opening area of the first spaced trenches 240 in total to the area of the cell region 231, after the spaced trenches 240 and 250 are fabricated. For instance, the opening pattern of each second spaced trench 250 can be larger than that of each first spaced trench 240, so that the etching rate for the second spaced trenches 250 is less than that for the first spaced trenches 140 due to the etching gas may be locally consumed too much at the second spaced trenches 250 and hence their etching rate is decreased temporarily. In another example, the aspect ratio of opening patterns of the first spaced trenches 240 can be less than that of the second spaced trenches 250, so that the trench depth of the second spaced trenches 250 in the termination region 232 can be less than that of the first spaced trenches 240 in the cell region 231 after the RIE process, according to the microloading effect and the ARDE effect in the RIE.

After the trench etching, the 50 nm Ti film serves as the second contact metal 260. Then, a Ni film with a thickness of 50 nm can be deposited conformally in trenches 240 and 250 as the third contact metal 270; i.e., the third contact metal 270 is covering the second contact metal 260 on the mesas 241 and 251 and sidewalls and bottoms 242 and 252 of the first and second spaced trenches 240 and 250. After treated by annealing the as-prepared device 200 at 500 for 10 minutes, a first Schottky contact can be formed on the mesas 241 and 251 between the second contact metal (the Ti film in this embodiment) 260 and the SiC drift layer 230, and a second Schottky contact can be formed on the sidewalls and bottoms 242 and 252 of the first and second spaced trenches 240 and 250 between the third contact metal (the Ni film in this embodiment) 270 and the SiC drift layer 230. Because nickel has a work function larger than titanium, the second Schottky contact has a higher barrier than the first Schottky contact. Thereby, when the Schottky device 200 is forward-biased, the first Schottky contact can be turned on first, providing a lower forward voltage drop and power loss. On the other hand, when the Schottky device 200 is in the reverse-biased mode, the depletion region of the high barrier second Schottky contact can extend to shield electric field on the low barrier first Schottky contact and thus reduces the leakage current.

Then, an Al—Si or Al—Cu alloy layer (not shown) with a thickness of 4 μm can be deposited on the third contact metal 270, extending from the cell region 231 to the termination region 232, to be used as an anode of the Schottky device 200. After the above fabrication process, the Schottky devices formed on the N⁺-type 4H—SiC wafer (the SiC substrate) can be separated into individual Schottky device dice, by the die sawing or laser cutting along scribe lines in the termination region 132. Each Schottky device die can be further packaged to be a discrete SiC-based trench-type Schottky device of the present embodiment.

Figure 7:
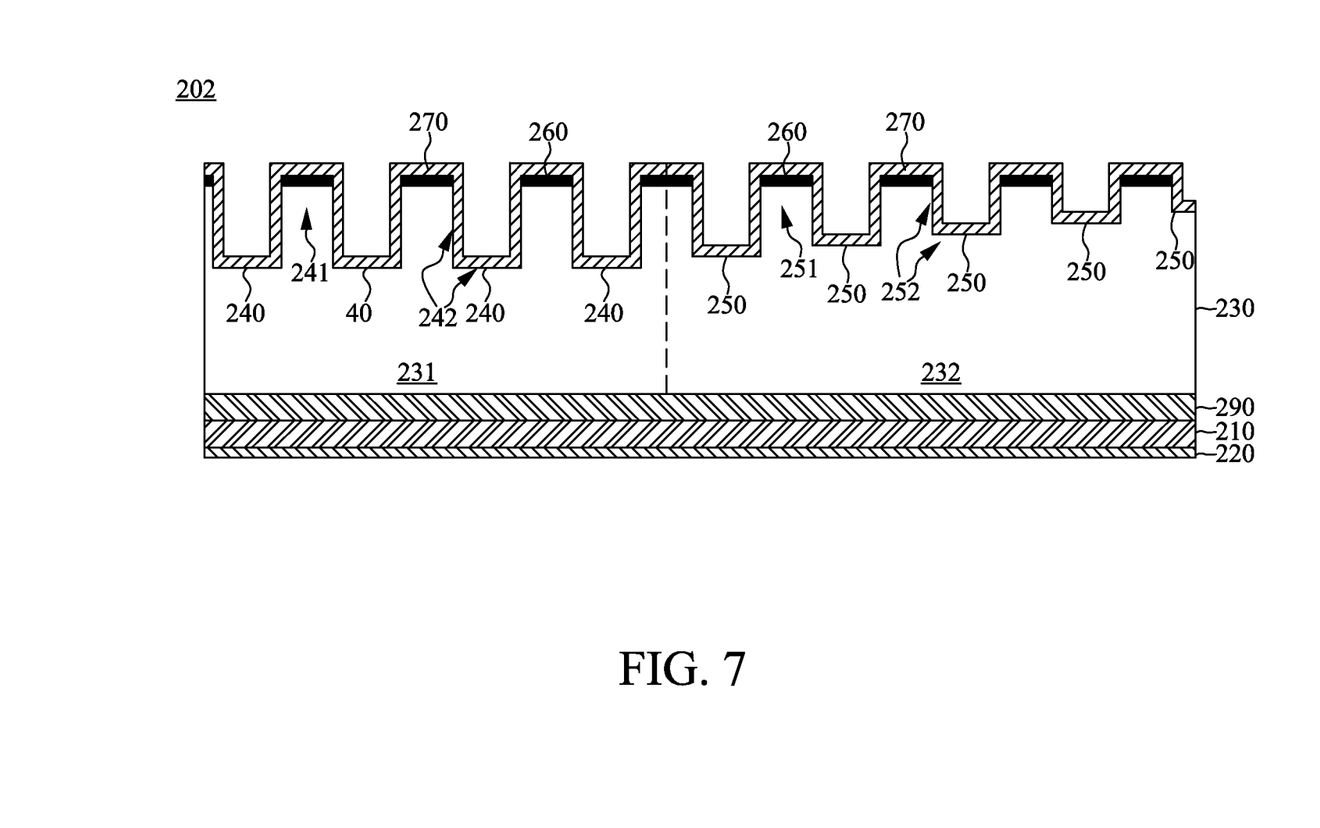
FIG. 7 schematically shows a vertical cross-section diagram of a SiC-based trench-type Schottky device according to a sixth embodiment of the present disclosure.

FIG. 7 schematically shows a vertical cross-section diagram of a SiC-based trench-type Schottky device 202 according to a sixth embodiment of the present disclosure. A top-view layout of the Schottky device 202 in the embodiment can also be referred to FIG. 2, also. Referring to both FIGS. 2 and 7, the first spaced trenches 240 can have uniform depths in the cell region 231, while the second spaced trenches 250 can have stepped depths in the termination region 232, wherein the second spaced trenches 250 can have decreasing depths as further away from the cell region 231, and the maximum depth of the second spaced trenches 250 can be less than the depth of the first spaced trenches 240. Fabrication process of the Schottky device 202 in this embodiment is similar to that of the Schottky device 200 in the fifth embodiment, except that the first spaced trenches 240 in the cell region 231 can have opening patterns of uniform size while the second spaced trenches 250 in the termination region 232 can have opening patterns of increasing size. Consequently, the ratio of the opening area of the second spaced trenches 250 in total to the area of the termination region 232 is larger than the ratio of the opening area of the first spaced trenches 240 in total to the area of the cell region 231. Also, each of the second spaced trenches 250 can have a larger opening area than the first spaced trenches 240, and the second spaced trench 250 close to the cell region 231 can have a larger opening area than the one away from the cell region 232. Thereby, the first spaced trenches 240 and the second spaced trenches 250 can be fabricated concurrently in the SiC drift layer 130, with the second spaced trenches 250 having decreasing depths as further away from the center of the Schottky device 202. The device reliability can be improved due to gradual decrease of electric field in the termination region 232 when the Schottky device 202 is reversely biased.

Figure 8:
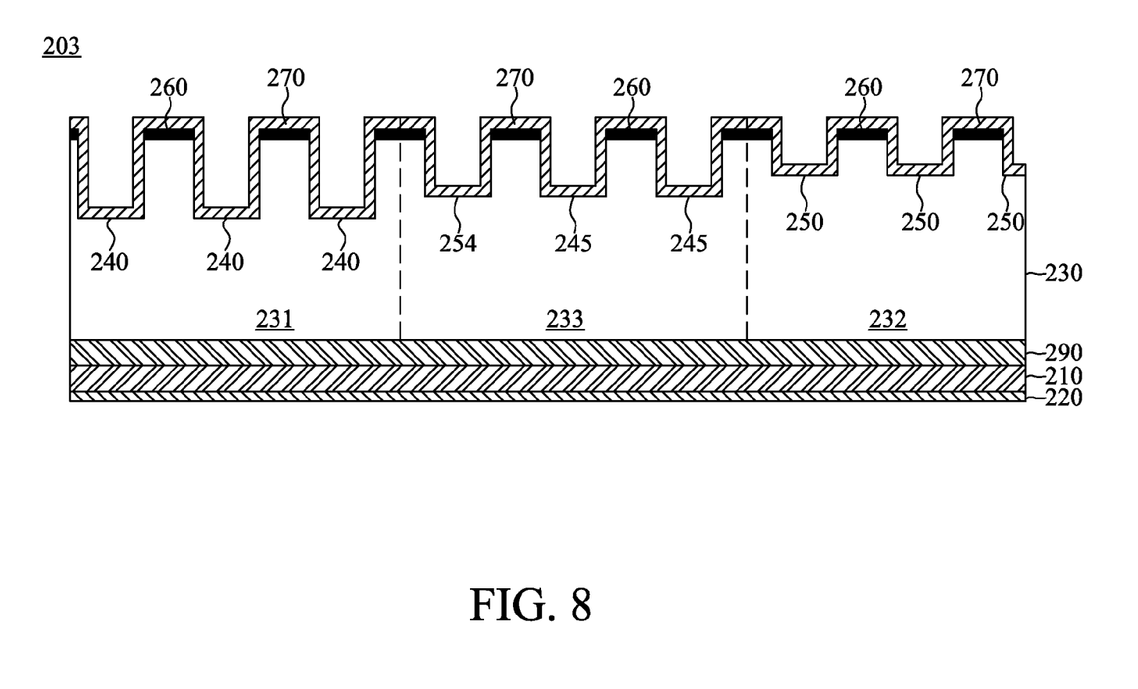
FIG. 8 schematically shows a vertical cross-section diagram of a SiC-based trench-type Schottky device according to a seventh embodiment of the present disclosure.

FIG. 8 schematically shows a vertical cross-section diagram of a SiC-based trench-type Schottky device 203 according to a seventh embodiment of the present disclosure. A top-view layout of the Schottky device 203 in the embodiment can also be referred to FIG. 4B, also. Referring to FIGS. 4B and 8, the top surface of the SiC drift layer 230 can include a transition region 233 interposed between the cell region 231 and the termination region 232. A plurality of third spaced trenches 245 can be formed in the transition region 233, which functions as a buffer region between the cell region 231 and the termination region 232. The first spaced trenches 240 can have uniform first depths, the second spaced trenches 250 can have uniform second depths, and the third spaced trenches 245 can have uniform third depths, with the third depth less than the first depth and more than the second depth. Fabrication process and the other composition parts of the Schottky device 203 in this embodiment are similar to that of the Schottky device 200 in the fifth embodiment.

In the embodiment, the first spaced trenches 240 in the cell region 231 can have a first opening pattern of uniform size, the second spaced trenches 250 in the termination region 232 can have a second opening pattern of uniform size, and the third spaced trenches 245 in the transition region 233 can have a third opening pattern of uniform size, so that the ratio of the opening area of the third spaced trenches 245 in total to the area of the transition region 233 is larger than the ratio of the opening area of the first spaced trenches 240 in total to the area of the cell region 231 while less than the ratio of the opening area of the second spaced trenches 250 in total to the area of the termination region 232. For example, each of the third spaced trenches 245 can have an opening area larger than each of the first spaced trenches 240 while less than each of the second spaced trenches 250. Thereby, according to the fabrication process similar to the first embodiment, the first spaced trenches 240, the third spaced trenches 245, and the second spaced trenches 250 can be fabricated concurrently in the SiC drift layer 230 with the trenches 240, 245, and 250 having decreasingly stepped depths as further away from the center of the Schottky device 203. The device reliability can be improved due to gradual decrease of electric field in the Schottky device 203 when it is in the reverse-biased mode.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A SiC-based trench-type Schottky device, comprising:
   a SiC substrate having a first surface and an opposing second surface;
   a first contact metal formed on the second surface of the SiC substrate and configured for forming an ohmic contact between the first contact metal and the SiC substrate;
   a SiC drift layer formed on the first surface of the SiC substrate and including a cell region and a termination region enclosing the cell region;
   a plurality of first spaced trenches with a first depth formed in the cell region;
   a plurality of second spaced trenches with a second depth formed in the termination region, wherein the second depth is less than the first depth;
   a plurality of mesas formed in the SiC drift layer, each defined between neighboring ones of the first and the second spaced trenches;
   an insulating layer formed on sidewalls and bottoms of the first and the second spaced trenches; and
   a second contact metal formed on the mesas and the insulating layer, extending from the cell region to the termination region, and configured for forming a Schottky contact between the second contact metal and the mesas of the SiC substrate.

2. The SiC-based trench-type Schottky device of claim 1, wherein the SiC substrate comprises a heavily doped N-type 4H—SiC substrate.

3. The SiC-based trench-type Schottky device of claim 1, wherein the SiC drift layer comprises a lightly doped N-type 4H—SiC epitaxial layer.

4. The SiC-based trench-type Schottky device of claim 1, further comprising:
   a conducting material formed between the second contact metal and the insulating layer.

5. The SiC-based trench-type Schottky device of claim 1, further comprising:
   a buffer layer formed of N-type 4H—SiC and between the SiC drift layer and the SiC substrate.

6. The SiC-based trench-type Schottky device of claim 1, wherein the ratio of the opening area of the second spaced trenches in total to the area of the termination region is larger than the ratio of the opening area of the first spaced trenches in total to the area of the cell region.

7. The SiC-based trench-type Schottky device of claim 1, wherein the SiC drift layer further comprises:
   a transition region interposed between the cell region and the termination region, wherein a plurality of third spaced trenches with a third depth less than the first depth and more than the second depth are formed in the transition region.

8. A SiC-based trench-type Schottky device comprising:
   a SiC substrate having a first surface and an opposing second surface;
   a first contact metal formed on the second surface of the SiC substrate and configured for forming an ohmic contact between the first contact metal and the SiC substrate;
   a SiC drift layer formed on the first surface of the SiC substrate and including a cell region and a termination region enclosing the cell region;
   a plurality of first spaced trenches with a first depth formed in the cell region;
   a plurality of second spaced trenches with a second depth formed in the termination region, where in the second depth is less than the first depth;
   a plurality of mesas formed in the SiC drift layer, each defined between neighboring ones of the first and the second spaced trenches;
   a second contact metal layer formed on the mesas and configured for forming a first Schottky contact between the second contact metal layer and the mesas of the SiC substrate; and
   a third contact metal formed on sidewalls and bottoms of the first and the second spaced trenches and configured for forming a second Schottky contact between the third contact metal and the sidewalls and bottoms of the first and the second spaced trenches of the SiC substrate;
   wherein work function of the second contact metal layer is less than that of the third contact metal.

9. The SiC-based trench-type Schottky device of claim 8, wherein the SiC substrate comprises a heavily doped N-type 4H—SiC substrate.

10. The SiC-based trench-type Schottky device of claim 8, wherein the SiC drift layer comprises a lightly doped N-type 4H—SiC epitaxial layer.

11. The SiC-based trench-type Schottky device of claim 8, further comprising:
    a buffer layer formed of N-type 4H—SiC and between the SiC drift layer and the SiC substrate.

12. The SiC-based trench-type Schottky device of claim 8, wherein the ratio of the opening area of the second spaced trenches in total to the area of the termination region is larger than the ratio of the opening area of the first spaced trenches in total to the area of the cell region.

13. The SiC-based trench-type Schottky device of claim 8, wherein the SiC drift layer further comprises:
  a transition region interposed between the cell region and the termination region, wherein a plurality of third spaced trenches with a third depth less than the first depth and more than the second depth are formed in the transition region.

* * * * *